United States Patent
Gosavi et al.

(10) Patent No.: US 11,374,164 B2
(45) Date of Patent: Jun. 28, 2022

(54) MULTI-LAYER SPIN ORBIT TORQUE ELECTRODES FOR PERPENDICULAR MAGNETIC RANDOM ACCESS MEMORY

(71) Applicant: Intel Corporation, Santa Clara, CA (US)

(72) Inventors: Tanay Gosavi, Hillsboro, OR (US); Sasikanth Manipatruni, Portland, OR (US); Chia-Ching Lin, Portland, OR (US); Kaan Oguz, Beaverton, OR (US); Christopher Wiegand, Portland, OR (US); Angeline Smith, Hillsboro, OR (US); Noriyuki Sato, Hillsboro, OR (US); Kevin O'Brien, Portland, OR (US); Benjamin Buford, Hillsboro, OR (US); Ian Young, Portland, OR (US); Md Tofizur Rahman, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 852 days.

(21) Appl. No.: 16/024,714

(22) Filed: Jun. 29, 2018

(65) Prior Publication Data
US 2020/0006637 A1   Jan. 2, 2020

(51) Int. Cl.
*H01L 43/02*   (2006.01)
*H01L 27/22*   (2006.01)
*H01L 43/12*   (2006.01)

(52) U.S. Cl.
CPC ............ *H01L 43/02* (2013.01); *H01L 27/228* (2013.01); *H01L 43/12* (2013.01)

(58) Field of Classification Search
CPC ........ H01L 43/02; H01L 43/12; H01L 27/228

USPC ........................................................ 257/421
See application file for complete search history.

(56) References Cited

U.S. PATENT DOCUMENTS

| | | | |
|---|---|---|---|
| 9,916,882 B2* | 3/2018 | Shirotori | G11C 11/1673 |
| 2013/0334633 A1* | 12/2013 | Zhou | H01L 43/10 |
| | | | 257/421 |
| 2015/0333123 A1 | 11/2015 | Koo | |
| 2017/0076769 A1 | 3/2017 | Shirotori | |
| 2018/0351084 A1* | 12/2018 | Sasaki | H01L 43/02 |

FOREIGN PATENT DOCUMENTS

WO   WO 2018/111245   6/2018

OTHER PUBLICATIONS

Search Report for European Patent Application No. 19176623.7 dated Dec. 9, 2019, 8 pgs.

* cited by examiner

*Primary Examiner* — Tu-Tu V Ho
(74) *Attorney, Agent, or Firm* — Schwabe, Williamson & Wyatt, P.C.

(57) ABSTRACT

Embodiments herein relate to a system, apparatus, and/or process for producing a spin orbit torque (SOT) electrode that includes a first layer with a first side to couple with a free layer of a magnetic tunnel junction (MTJ) and a second layer coupled with a second side of the first layer opposite the first side, where a value of an electrical resistance in the first SOT layer is lower than a value of an electrical resistance in the second SOT layer and where a current applied to the SOT electrode is to cause current to preferentially flow in the first SOT layer to cause a magnetic polarization of the free layer to change directions. During production of the SOT electrode, the second layer may act as an etch stop.

21 Claims, 6 Drawing Sheets

MULTI-LAYER SPIN ORBIT TORQUE ELECTRODES FOR PERPENDICULAR MAGNETIC RANDOM ACCESS MEMORY

FIELD

Embodiments of the present disclosure generally relate to the field of magnetic random access memory (MRAM), and in particular the composition of spin orbit torque (SOT) electrodes.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

For in-plane polarized magnetic films, electron spin currents arising from the spin-Hall effect (SHE) within heavy metal has been shown to apply spin-transfer torques to a magnet. The SHE may be used to change a magnetic polarity of a free layer of a magnetic tunnel junction (MTJ) that may be used to implement MRAM.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
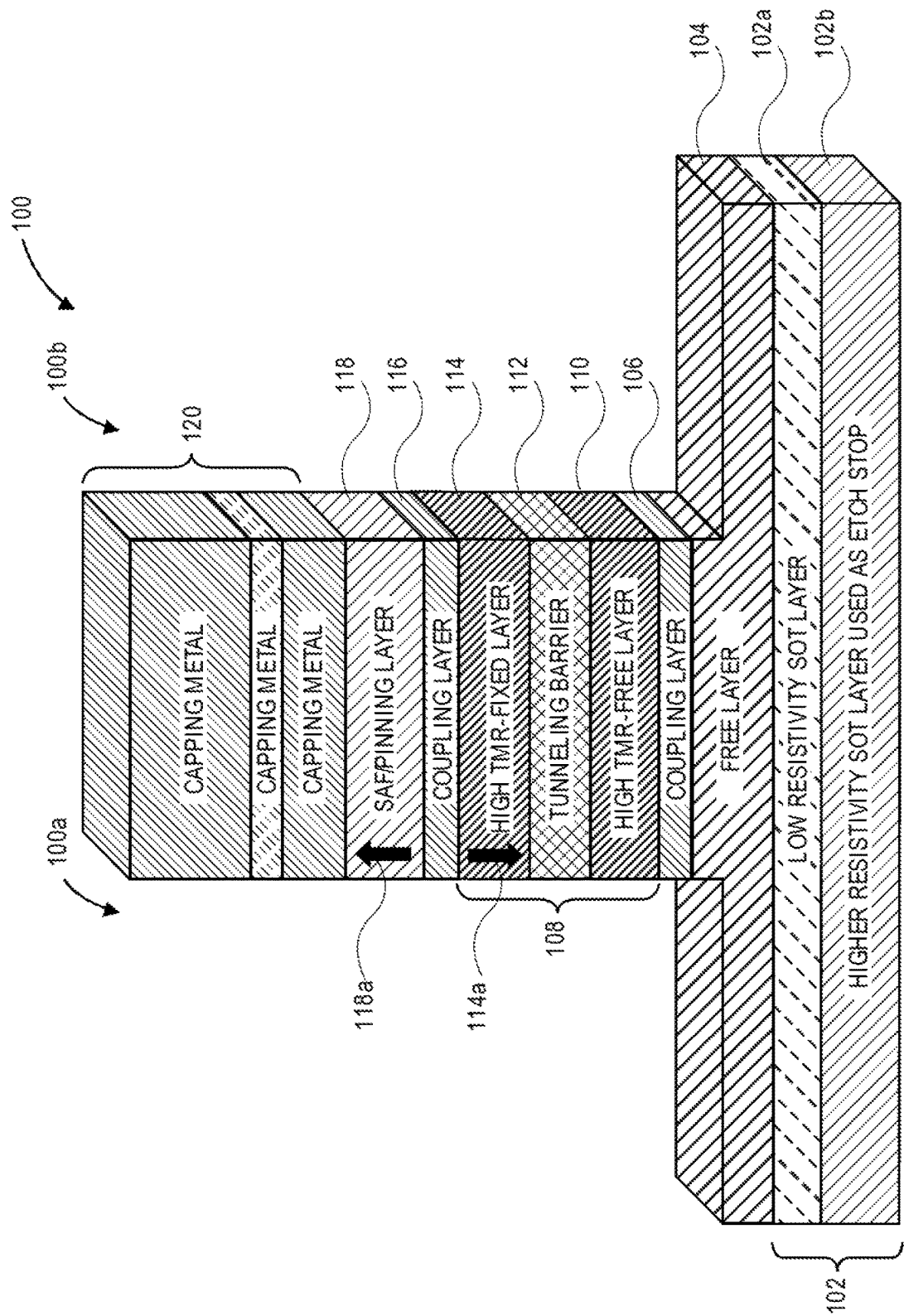
FIG. 1 illustrates a stage during the manufacture of a MRAM stack with a MTJ that includes multiple layers of an SOT electrode, in accordance with one implementation of the invention.

Embodiments of the present disclosure generally relate to apparatuses, processes, or systems to manufacture or use MRAM. In legacy implementations, the MRAM may include a SOT electrode that may include a heavy metal, 2D material, Antiferromagnet (AFM) or topological insulator (TI). The SOT electrode may facilitate switching the magnetic field within a free layer of a MTJ magnetically coupled to the SOT electrode. The SOT may enable use of complex magnetic stacks developed with a synthetic antiferromagnet (SAF) to implement spin transfer torque memory by changing the polarity direction of the magnetic field in the magnetic free layer of the MTJ.

In embodiments, the SOT electrode may be implemented as a multilayer SOT electrode having different layers with different values of electrical resistivity. In embodiments, a low resistivity SOT material, that may have high spin conductivity, as a top SOT layer that may be connected to a magnetic free layer of a MTJ, while the bottom SOT layer may be high resistivity, that may have low spin conductivity. In embodiments, the metal that may make up the bottom SOT layer may be generally thicker and maybe used as an etch stop during manufacturing.

In legacy implementations, patterning an SOT electrode may have challenges. First, the SOT electrode is typically only a few nanometers thick, for example between 0.5 nanometers and 20 nanometers thick, and at the bottom of a large magnetic stack. In such a configuration, stopping an etching process on an exact film layer can be imprecise and may result in over-etching the layer. Over etching may adversely affect manufacturing yield, and may increase the SOT electrode interconnect resistance. For example, the legacy SOT electrode may be a local interconnect under the MTJ between two vias that connect to transistors. If the legacy SOT layer exceeds a resistance threshold, a higher voltage may need to be applied to achieve enough current density to switch the free layer magnet in the MTJ which may affect the operating efficiency of the MRAM device.

Embodiments described herein may facilitate the MRAM manufacturing process by relaxing constraints on etching the MRAM and allowing for etching into the SOT electrode. In embodiments, the etching process may continue into the SOT electrode with a lower layer, and a higher electrical resistance, in the SOT electrode acting as an etch stop. When a current is applied to the SOT electrode, the high spin conductivity of the top SOT electrode layer may allow more current to flow in that top layer, adjacent to the magnetic free layer, and generate spin current for SOT switching of a magnetic free layer adjacent to the SOT electrode. Although part of the SOT electrode may be etched way, a low impedance interconnect from the SOT to the magnetic free layer of the MTJ is still available.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an application specific integrated circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

FIG. 1 illustrates a stage during the manufacture of a MRAM stack with a MTJ that includes multiple layers of an SOT electrode, in accordance with one implementation of the invention. Diagram 100 is an embodiment of a MRAM stack that may include a multilayer SOT electrode 102. In embodiments, the SOT electrode 102 may include a low resistivity SOT layer 102a and a high resistivity SOT layer 102b. The low resistivity SOT layer 102a may be coupled with a magnetic free layer 104 which in turn may be coupled to a coupling layer 106. In embodiments, the coupling layer 106 may be coupled to an MTJ 108, that may include a magnetic free layer 110, a tunneling barrier 112, and a magnetic fixed layer 114. In embodiments, the magnetic free layer 110 may have high tunnel magnetoresistance (TMR) properties, and the magnetic fixed layer 114 may have high TMR properties. In embodiments, the high TMR layer may be implemented by one or more Ferromagnetic layer.

In embodiments, the magnetic fixed layer 114 may be a fixed magnet having a fixed polarity. In embodiments, the polarity may be perpendicular to the SOT electrode 102. The tunneling barrier 112 may be a magnesium oxide (MgO) tunneling oxide.

In embodiments, the magnetic fixed layer 114 of the MTJ 108 may be coupled with a coupling layer 116 that may be coupled to a synthetic anti-Ferro-magnet (SAF) layer 118. The SAF layer 118 may have a polarity direction 118a that may be perpendicular to a plane of the SOT electrode 102. The SAF layer 118 may facilitate maintaining a polarity direction 114a of the magnetic fixed layer 114. In embodiments, one or more capping metals 120 may be applied to the SAF layer 118 that may complete the layers of the MRAM stack 100. The MRAM stack 100 is in a partial etching process where the stack is being etched 100a, 100b, toward the magnetic free layer 104.

In embodiments, the composition of the SOT electrode 102 may include one or more heavy metals, AFM, or topological insulator (TI). In embodiments, SOT electrode 102 may include spin orbit TI, 2D or 3D materials which may include, but are not limited to, one or more of: graphene, $TiSe_2$, $WSe_2$, $MoS_2$, $WSe_2$, $MoSe_2$, $B_2S_3$, $Sb_2S_3$, $Ta_2S$, $Re_2S_7$, $LaCPS_2$, $LaOAsS_2$, $ScOBiS_2$, $GaOBiS_2$, $AlOBiS_2$, $LaOSbS_2$, $BiOBiS_2$, $YOBiS_2$, $InOBiS_2$, $LaOBiSe_2$, $TiOBiS_2$, $CeOBiS_2$, $PrOBiS_2$, $NdOBiS_2$, $LaOBiS_2$, or $SrFBiS_2$. In embodiments, SOT electrode 426 may include spin orbit material that may exhibit a Rashba-Bychkov effect in the form $ROCh_2$, where 'It' includes, but is not limited to, one or more of: La, Ce, Pr, Nd, Sr, Sc, Ga, Al, or In, and where "Ch" may be a chalcogenide which may include, but is not limited to, one or more of: S, Se, or Te.

An AFM may include, but is not limited to, Co/Antiferro-magnet, Fe/Antiferro-magnet, Ni/Antiferro-magnet, MnGa/Antiferro-magnet, MnGeGa/Antiferro-magnet, or Bct-Ru/Antiferro-magnet. A TI may also include, but is not limited to, $Bi_2Se_3$, $Bi_xTeySe_{1-x-y}$, $Bi_xSb_{1-x}$, $WSe_2$, $WTe_2$, $PtSe_2$, $PtTe_2$, $MoSe_2$, $MoS_2$, or $MoTe_2$, $TiS_2$, $WS_2$, $TiSe_2$, $B_2S_3$, $Sb_2S_3$, $Ta_2S$, $Re_2S_7$, $LaCPS_2$, $LaOAsS_2$, $ScOBiS_2$, $GaOBiS_2$, $AlOBiS_2$, $LaOSbS_2$, $BiOBiS_2$, $YOBiS_2$, $InOBiS_2$, $LaOBiSe_2$, $TiOBiS_2$, $CeOBiS_2$, $PrOBiS_2$, $NdOBiS_2$, $LaOBiS_2$, or $SrFBiS_2$.

In embodiments, the SOT materials may be combined so that the material in the low resistivity SOT layer 102a may have a lower electrical resistance as compared to the high resistivity SOT layer 102b to achieve a higher efficiency of switching the polarity of the magnetic free layer 104. In embodiments, the lower resistance can be also achieved by mixing the materials with and/or doping with Cu, Al, or similar high-conductive materials.

In embodiments, the SOT electrode 102 as well as the SOT layers 102a, 102b may be magnetically doped using the magnetic material (not shown) that may include ferromagnets such as cobalt (Co), iron (Fe), nickel (Ni), MnGa, MnGeGa, Bct-Ru, Gd, or Tb. The magnetic material (not shown) may include material with perpendicular magnetic anisotropy (PMA) with an anisotropy axis perpendicular to a plane of the SOT electrode 102.

As a result, the SOT electrode 102 may have a net magnetic moment that may interact with the adjacent magnetic free layer, such as magnetic free layer 114, which may be similar to magnetic free layer 110 of FIG. 1. As a result, this may apply an effective field on the free layer magnet in a direction opposite to the internal magnetic moment. This effective field may then break the symmetry of the spin orbit switching of the free layer, thereby enabling repeatable bidirectional current switching. The doped SOT layer may create an inplane exchange bias or a dipole field. This resulting effective field may generate an inplane magnetic field on the perpendicular magnetic free layer of the MTJ. This may then facilitate deterministic bidirectional switching of the MRAM by flipping the polarity of the magnetic free layer 110 depending on the direction of current flow through the SOT element 102. This may enable repeatable bidirectional switching of a perpendicular magnetic polarity within magnetic free layers such as magnetic free layer 110 within the MRAM.

In embodiments, the partial MRAM stack 100 may be etched, for example on sides 100a, 100b to form a nano pillar. In embodiments, the etching process may include ion beam etching (IBE) or reactive ion etching (ME).

Figure 2:
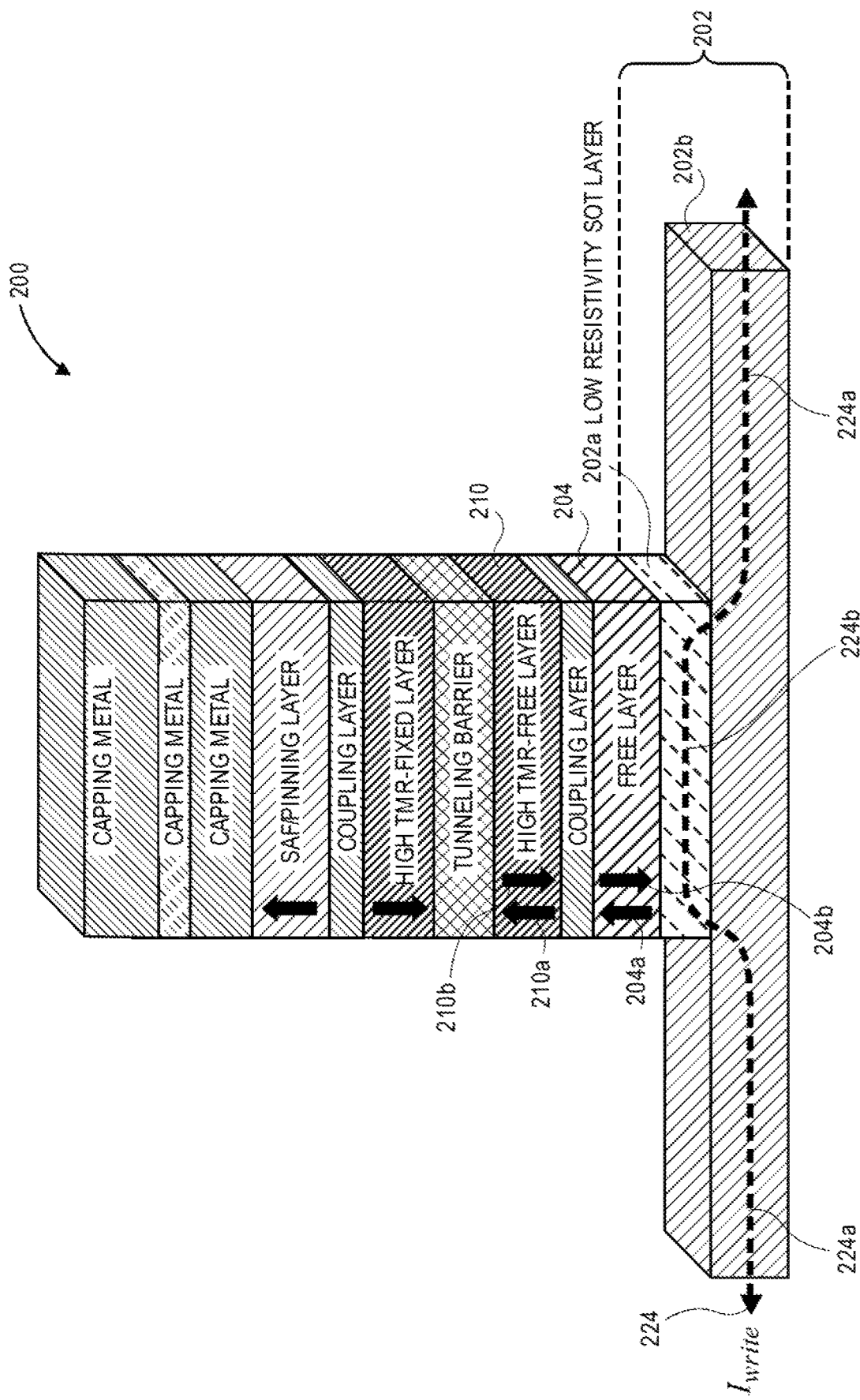
FIG. 2 illustrates a stage during the manufacture of a MRAM stack with a MTJ that includes a layer of the SOT electrode as an etch stop, in accordance with one implementation of the invention.

FIG. 2 illustrates a stage during the manufacture of a MRAM stack with a MTJ that includes a layer of the SOT electrode as an etch stop, in accordance with one implementation of the invention. Diagram 200 is an embodiment of a MRAM stack that may be etched down to the high resistivity SOT layer 202b, which may be similar to the high resistivity SOT layer 102b of FIG. 1.

In embodiments, when a current 224 is applied to the SOT electrode 202, the current 224 may first flow through the second layer 202b along a current path 224a until the current reaches the low resistivity SOT layer 202a. At this point, a majority of the current 224 may preferentially flow along the lower resistivity current path 224b through the low resistivity SOT layer 202a. As a result, this may generate electron spins via the high spin conductivity of the low resistivity SOT layer 202a. As a result, these spins may impinge on the magnetic free layer 204 and as a result switch the polarity of the magnetic free layer 204. For example, the polarity may switch from 204a to 204b, or from 204b to 204a depending upon the direction of the current flow 224.

In embodiments, the current flow 224 may also switch the polarity of the high TMR magnetic free layer 210. For example, polarity may switch from 210a to 210b, or from 210b to 210a depending upon the direction of the current flow 224.

Figure 3:
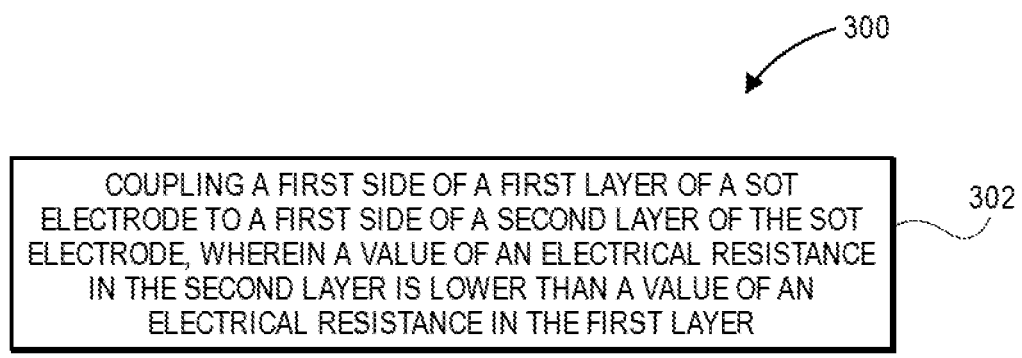
FIG. 3 illustrates an example process that uses a high resistivity SOT layer as an etch stop during the manufacture of a MRAM stack, in accordance with one implementation of the invention.

FIG. 3 illustrates an example process that uses a high resistivity SOT layer as an etch stop during the manufacture of a MRAM stack, in accordance with one implementation of the invention. The process 300 be implemented by the techniques and materials described in FIGS. 1-2.

At block 302, the process may include coupling a first side of a first layer of a SOT electrode to a first side of a second layer of the SOT electrode, wherein a value of an electrical resistance in the second layer is lower than a value of an electrical resistance in the first layer. In embodiments, the first layer of the SOT electrode may correspond to the high resistivity SOT layer 102b of FIG. 1 and the second layer of the SOT electrode may correspond to the low resistivity SOT layer 102a. As a result, when current may be applied to the SOT electrode 102, current will preferentially flow in the low resistivity SOT layer 102a.

In addition, the process may include coupling a first side of a free layer of a magnetic tunnel junction (MTJ) to a second side of the second layer opposite the first side. In embodiments, the free layer may be similar to the magnetic free layer 104 of FIG. 1 that may be coupled with the MTJ 108. In other embodiments, the free layer may be similar to the magnetic free layer 110, where there is no magnetic free layer 104 or coupling layer 106. In embodiments, the magnetic free layer 104, coupling layer 106 may be coupled with the low resistivity SOT layer 102a.

The process may include etching the package. In embodiments, the etching may be similar to the etching of the sides 100a, 100b of FIG. 1. In embodiments, the etching may continue down to the second layer of the SOT electrode as an etch stop, as may be shown in FIG. 2. The etching may continue through the low resistivity SOT layer 202a to expose the high resistivity SOT layer 202b Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide (SiO2) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide (SiO2), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 4:
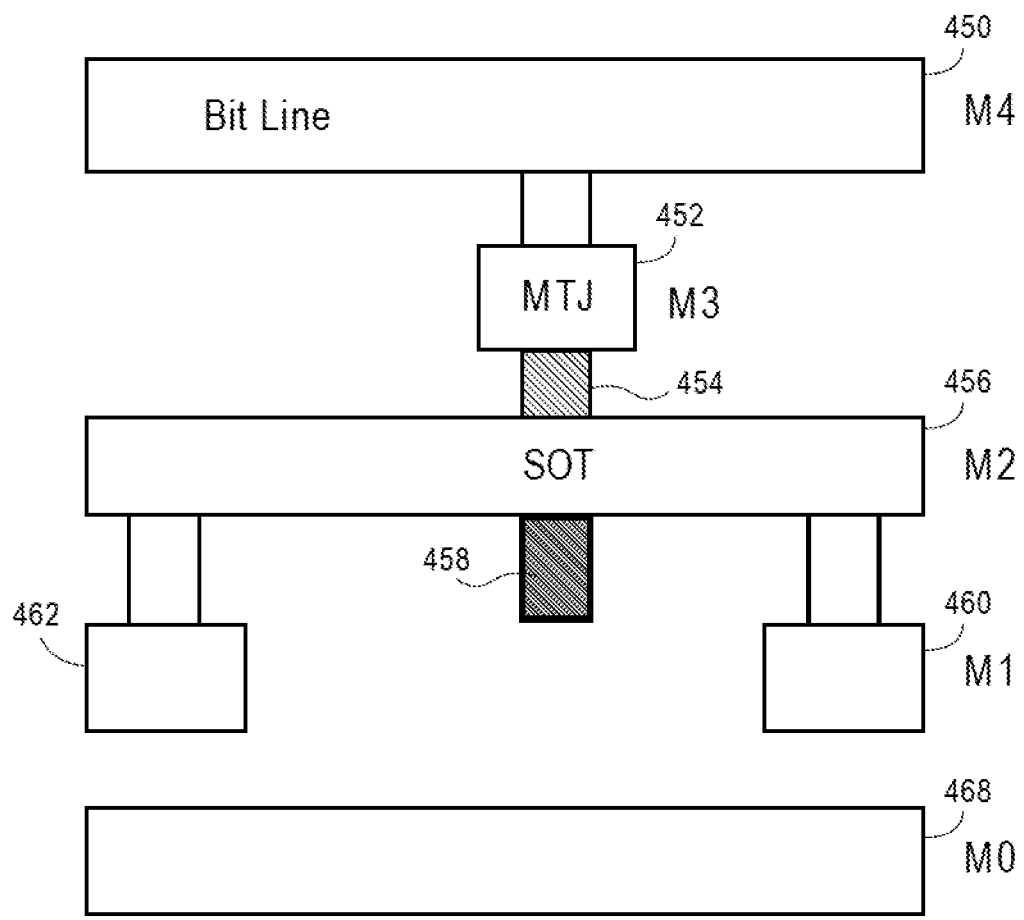
FIG. 4 shows a complimentary metal-oxide-semiconductor (CMOS) stack that integrates an MRAM, in accordance with various embodiments.

FIG. 4 shows a CMOS stack that integrates an MRAM, in accordance with various embodiments. The MTJ 452, which may be in metal layer 3, may be similar to MTJ 108 of FIG. 1, and may be coupled to the SOT 456, which may be in metal layer 2, and may be similar to SOT 102 of FIG. 1 or SOT 202 of FIG. 2. Magnetic via 458 may include magnetically active material in the via 458 that may apply an in-plane magnetic field to a magnetic free layer of the MTJ 452. The magnetic free layer may be similar to magnetic free layer 104 of FIG. 1 or magnetic free layers 204, 210 of FIG. 2.

Sources for current flow through the SOT 456 may be through metal layer 1 via 462 and/or through metal layer 1 via 460. Bit line 450, which may be in metal layer 4, may provide current to the MTJ 452 that may be used to read a bit of the MRAM. Metal layer 0 468 may be at the bottom of the CMOS stack.

Figure 5:
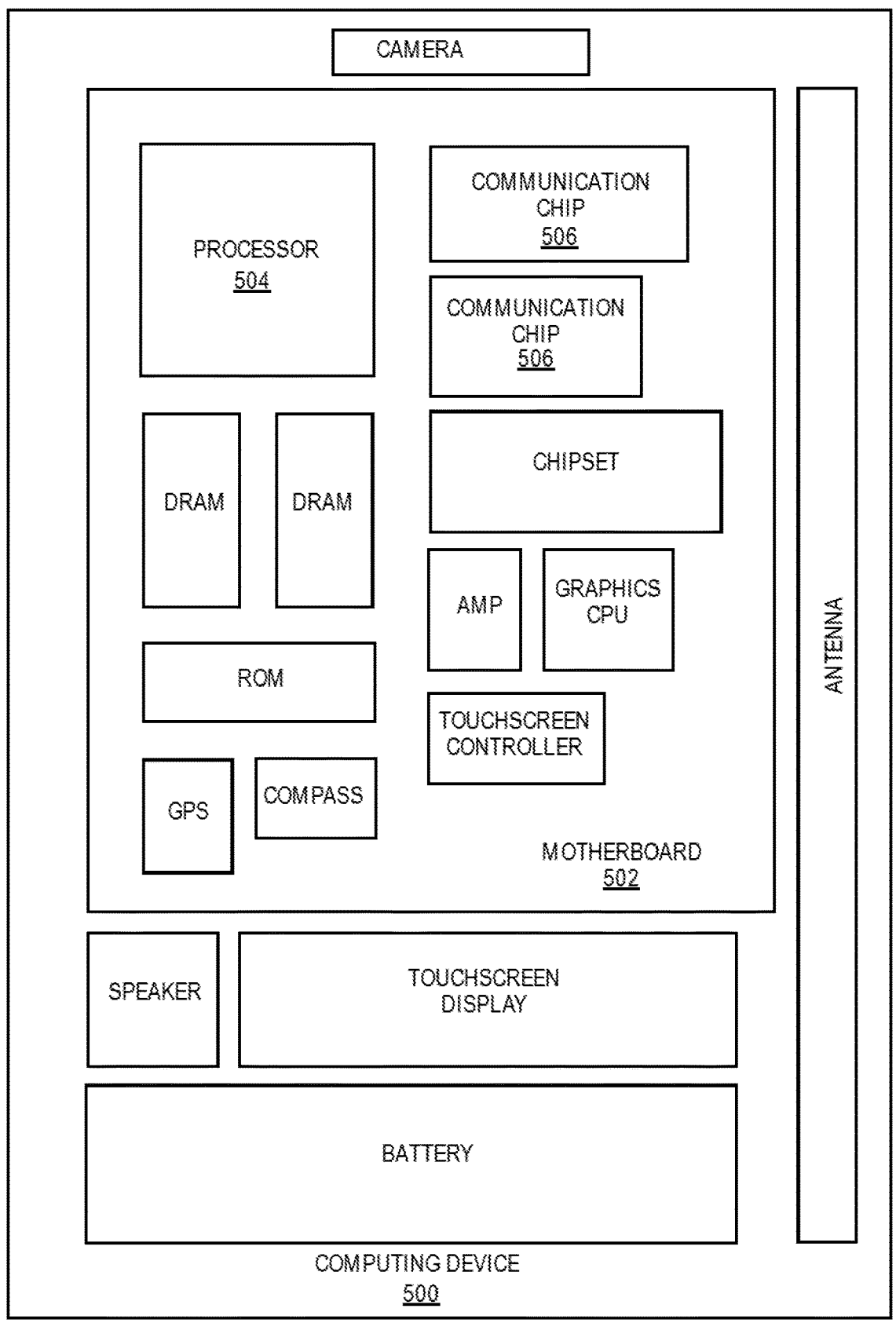
FIG. 5 illustrates a computing device 500 in accordance with one implementation of the invention.

FIG. 5 illustrates a computing device 500 in accordance with one implementation of the invention. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

Depending on its applications, computing device 500 may include other components that may or may not be physically and electrically coupled to the board 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 506 also includes an integrated circuit die packaged within the communication chip 506. In accordance with another implementation of the invention, the integrated circuit die of the communication chip includes one or more devices, such as MOS-FET transistors built in accordance with implementations of the invention.

In further implementations, another component housed within the computing device 500 may contain an integrated circuit die that includes one or more devices, such as MOS-FET transistors built in accordance with implementations of the invention.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Figure 6:
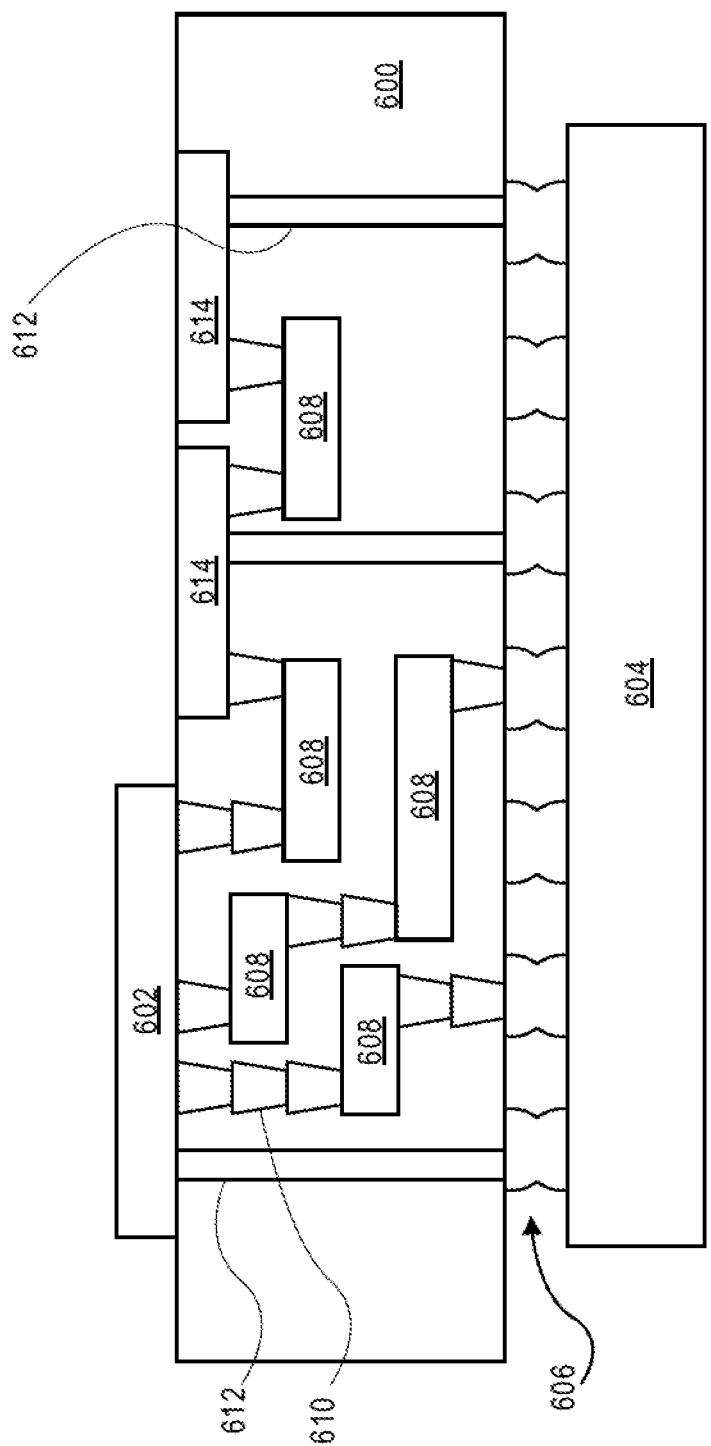
FIG. 6 illustrates an interposer 600 that includes one or more embodiments of the invention.

FIG. 6 illustrates an interposer 600 that includes one or more embodiments of the invention. The interposer 600 is an intervening substrate used to bridge a first substrate 602 to a second substrate 604. The first substrate 602 may be, for instance, an integrated circuit die. The second substrate 604 may be, for instance, a memory module, a computer motherboard, or another integrated circuit die. Generally, the purpose of an interposer 600 is to spread a connection to a wider pitch or to reroute a connection to a different connection. For example, an interposer 600 may couple an integrated circuit die to a ball grid array (BGA) 606 that can subsequently be coupled to the second substrate 604. In some embodiments, the first and second substrates 602/604 are attached to opposing sides of the interposer 600. In other embodiments, the first and second substrates 602/604 are attached to the same side of the interposer 600. And in further embodiments, three or more substrates are interconnected by way of the interposer 600.

The interposer 600 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 608 and vias 610, including but not limited to through-silicon vias (TSVs) 612. The interposer 600 may further include embedded devices 614, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 600. In accordance with embodiments of the invention, apparatuses or processes disclosed herein may be used in the fabrication of interposer 600.

EXAMPLES

Example 1 may be a SOT electrode comprising: a first layer with a first side to couple with a free layer of a MTJ; and a second layer coupled with a second side of the first layer opposite the first side, wherein a value of an electrical resistance in the first SOT layer is lower than a value of an electrical resistance in the second SOT layer.

Example 2 may include the SOT electrode of example 1, wherein a value of spin conductivity in the first SOT layer is higher than a value of spin conductivity in the second SOT layer.

Example 3 may include the SOT electrode of example 1, wherein a current applied to the SOT electrode is to cause current to preferentially flow in the first SOT layer to cause a magnetic polarization of the free layer to change directions.

Example 4 may include the SOT electrode of example 3, wherein the magnetic polarization of the free layer is substantially perpendicular to the first side of the first layer.

Example 5 may include the SOT electrode of any one of examples 1-5, wherein the first layer and the second layer include one or more of: graphene, $TiS_2$, $WS_2$, $MoS_2$, $TiSe_2$, $WSe_2$, $MoSe_2$, $B_2S_3$, $Sb_2S_3$, $Ta_2S$, $Re_2S_7$, $LaCPS_2$, $LaOAsS_2$, $ScOBiS_2$, $GaOBiS_2$, $AlOBiS_2$, $LaOSbS_2$, $BiOBiS_2$, $YOBiS_2$, $InOBiS_2$, $LaOBiSe_2$, $TiOBiS_2$, $CeOBiS_2$, $PrOBiS_2$, $NdOBiS_2$, $LaOBiS_2$, or $SrFBiS_2$.

Example 6 may include the SOT electrode of example 1, wherein the first side of the first layer has a smaller area than a side of the second layer opposite a side of the second layer coupled with the second side of the first layer.

Example 7 may be an apparatus comprising: a MTJ having a free layer; a first layer of a first side of a SOT electrode coupled with the free layer; and a second layer of the SOT electrode coupled with a second side of the first layer opposite the first side, wherein a value of an electrical resistance in the first SOT layer is lower than a value of an electrical resistance in the second SOT layer.

Example 8 may include the apparatus of example 7, wherein a value of a spin conductivity in the first SOT layer is higher than a value of a spin conductivity in the second SOT layer.

Example 9 may include the apparatus of example 7, wherein current applied to the SOT electrode is to cause current to preferentially flow in the first SOT layer to cause a magnetic polarization of the free layer to change direction.

Example 10 may include the apparatus of example 9, wherein the magnetic polarization of the free layer is substantially perpendicular to the first side of the first layer.

Example 11 may include the apparatus of example 9, wherein current applied is a first current; and further comprising wherein a second current applied to the SOT electrode in an opposite direction to the first current will cause current to preferentially flow in the first SOT layer to cause a magnetic polarization of the free layer to change directions.

Example 12 may include the apparatus of any one of examples 7-12, wherein the first layer of the SOT electrode and the second layer of the SOT electrode include one or more of: graphene, $TiS_2$, $WS_2$, $MoS_2$, $TiSe_2$, $WSe_2$, $MoSe_2$, $B_2S_3$, $Sb_2S_3$, $Ta_2S$, $Re_2S_7$, $LaCPS_2$, $LaOAsS_2$, $ScOBiS_2$, $GaOBiS_2$, $AlOBiS_2$, $LaOSbS_2$, $BiOBiS_2$, $YOBiS_2$, $InOBiS_2$, $LaOBiSe_2$, $TiOBiS_2$, $CeOBiS_2$, $PrOBiS_2$, $NdOBiS_2$, $LaOBiS_2$, or $SrFBiS_2$.

Example 13 may include the apparatus of example 7, wherein the first side of the first layer of the SOT electrode has a smaller area than a side of the second layer of the SOT electrode opposite a side of the second layer of the SOT electrode coupled with the second side of the first layer.

Example 14 may be a method for creating a package, comprising: coupling a first side of a first layer of a SOT electrode to a first side of a second layer of the SOT electrode, wherein a value of an electrical resistance in the second layer is lower than a value of an electrical resistance in the first layer.

Example 15 may include the method of example 14, further comprising coupling a first side of a free layer of a MTJ to a second side of the second layer opposite the first side.

Example 16 may include the method of example 15, further comprising etching the package.

Example 17 may include the method of example 16, wherein the second layer of the SOT electrode is an etch stop.

Example 18 may include the method of example 15, further comprising, before etching the package: coupling a first side of an MTJ coupling layer to a second side of the free layer opposite the first side; and coupling a first side of an MTJ fixed layer to a second side of the MTJ coupling layer.

Example 19 may include the method of example 14, wherein a value of a spin conductivity in the first SOT layer is higher than a value of a spin conductivity in the second SOT layer.

Example 20 may include the method of any one of examples 14-19, wherein the first layer or the second layer include one or more of graphene, $TiS_2$, $WS_2$, $MoS_2$, $TiSe_2$, $WSe_2$, $MoSe_2$, $B_2S_3$, $Sb_2S_3$, $Ta_2S$, $Re_2S_7$, $LaCPS_2$, $LaOAsS_2$, $ScOBiS_2$, $GaOBiS_2$, $AlOBiS_2$, $LaOSbS_2$, $BiOBiS_2$, $YOBiS_2$, $InOBiS_2$, $LaOBiSe_2$, $TiOBiS_2$, $CeOBiS_2$, $PrOBiS_2$, $NdOBiS_2$, $LaOBiS_2$, or $SrFBiS_2$.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

What is claimed is:

1. A spin orbit torque (SOT) electrode comprising:
a first layer with a first side to couple with a free layer of a magnetic tunnel junction (MTJ);
a second layer coupled with a second side of the first layer opposite the first side, wherein a value of an electrical resistance in the first SOT layer is lower than a value of an electrical resistance in the second SOT layer; and
wherein the first SOT layer or the second SOT layer is doped with magnetic material.

2. The SOT electrode of claim 1, wherein a value of spin conductivity in the first SOT layer is higher than a value of spin conductivity in the second SOT layer.

3. The SOT electrode of claim 1, wherein a current applied to the SOT electrode is to cause current to preferentially flow in the first SOT layer to cause a magnetic polarization of the free layer to change directions.

4. The SOT electrode of claim 3, wherein the magnetic polarization of the free layer is substantially perpendicular to the first side of the first layer.

5. The SOT electrode of claim 1, wherein the first layer and the second layer include one or more of: graphene, $TiS_2$, $WS_2$, $MoS_2$, $TiSe_2$, $WSe_2$, $MoSe_2$, $B_2S_3$, $Sb_2S_3$, $Ta_2S$, $Re_2S_7$, $LaCPS_2$, $LaOAsS_2$, $ScOBiS_2$, $GaOBiS_2$, $AlOBiS_2$, $LaOSbS_2$, $BiOBiS_2$, $YOBiS_2$, $InOBiS_2$, $LaOBiSe_2$, $TiOBiS_2$, $CeOBiS_2$, $PrOBiS_2$, $NdOBiS_2$, $LaOBiS_2$, or $SrFBiS_2$.

6. The SOT electrode of claim 1, wherein the first side of the first layer has a smaller area than a side of the second layer opposite a side of the second layer coupled with the second side of the first layer.

7. The SOT electrode of claim 1, wherein the magnetic material has a perpendicular magnetic anisotropy with an anisotropy axis that is perpendicular to a selected one or more of: a plane of the first SOT layer or a plane of the second SOT layer.

8. An apparatus comprising:
a magnetic tunnel junction (MTJ) having a free layer;
a first layer of a first side of a spin orbit torque (SOT) electrode coupled with the free layer;
a second layer of the SOT electrode coupled with a second side of the first layer opposite the first side, wherein a value of an electrical resistance in the first SOT layer is lower than a value of an electrical resistance in the second SOT layer; and
wherein the first SOT layer or the second SOT layer is doped with magnetic material.

9. The apparatus of claim 8, wherein a value of a spin conductivity in the first SOT layer is higher than a value of a spin conductivity in the second SOT layer.

10. The apparatus of claim 8, wherein current applied to the SOT electrode is to cause current to preferentially flow in the first SOT layer to cause a magnetic polarization of the free layer to change direction.

11. The apparatus of claim 10, wherein the magnetic polarization of the free layer is substantially perpendicular to the first side of the first layer.

12. The apparatus of claim 10, wherein current applied is a first current; and
further comprising wherein a second current applied to the SOT electrode in an opposite direction to the first current will cause current to preferentially flow in the first SOT layer to cause a magnetic polarization of the free layer to change directions.

13. The apparatus of claim 8, wherein the first layer of the SOT electrode and the second layer of the SOT electrode include one or more of: graphene, $TiS_2$, $WS_2$, $MoS_2$, $TiSe_2$, $WSe_2$, $MoSe_2$, $B_2S_3$, $Sb_2S_3$, $Ta_2S$, $Re_2S_7$, $LaCPS_2$, $LaOAsS_2$, $ScOBiS_2$, $GaOBiS_2$, $AlOBiS_2$, $LaOSbS_2$, $BiOBiS_2$, $YOBiS_2$, $InOBiS_2$, $LaOBiSe_2$, $TiOBiS_2$, $CeOBiS_2$, $PrOBiS_2$, $NdOBiS_2$, $LaOBiS_2$, or $SrFBiS_2$.

14. The apparatus of claim 8, wherein the first side of the first layer of the SOT electrode has a smaller area than a side of the second layer of the SOT electrode opposite a side of the second layer of the SOT electrode coupled with the second side of the first layer.

15. A method for creating a package, comprising:
coupling a first side of a first layer of a spin orbit torque (SOT) electrode to a first side of a second layer of the SOT electrode, wherein a value of an electrical resistance in the second layer is lower than a value of an electrical resistance in the first layer, and wherein the first SOT layer or the second SOT layer is doped with magnetic material.

16. The method of claim 15, further comprising coupling a first side of a free layer of a magnetic tunnel junction (MTJ) to a second side of the second layer opposite the first side.

17. The method of claim 16, further comprising etching the package.

18. The method of claim 17, wherein the second layer of the SOT electrode is an etch stop.

19. The method of claim 16, further comprising, before etching the package:

coupling a first side of an MTJ coupling layer to a second side of the free layer opposite the first side; and coupling a first side of an MTJ fixed layer to a second side of the MTJ coupling layer.

20. The method of claim 15, wherein a value of a spin conductivity in the first SOT layer is higher than a value of a spin conductivity in the second SOT layer.

21. The method of claim 15, wherein the first layer or the second layer include one or more of graphene, $TiS_2$, $WS_2$, $MoS_2$, $TiSe_2$, $WSe_2$, $MoSe_2$, $B_2S_3$, $Sb_2S_3$, $Ta_2S$, $Re_2S_7$, $LaCPS_2$, $LaOAsS_2$, $ScOBiS_2$, $GaOBiS_2$, $AlOBiS_2$, $LaOSbS_2$, $BiOBiS_2$, $YOBiS_2$, $InOBiS_2$, $LaOBiSe_2$, $TiOBiS_2$, $CeOBiS_2$, $PrOBiS_2$, $NdOBiS_2$, $LaOBiS_2$, or $SrFBiS_2$.

* * * * *